United States Patent [19]
Ernst

[11] Patent Number: 5,565,801
[45] Date of Patent: Oct. 15, 1996

[54] INTEGRATED CIRCUIT FOR INDEPENDENTLY TESTING INDIVIDUAL ANALOG INTERNAL FUNCTIONAL BLOCKS

[75] Inventor: Holger Ernst, Hamburg, Germany

[73] Assignee: U.S. Philips Corporation, New York, N.Y.

[21] Appl. No.: 489,466

[22] Filed: Jun. 12, 1995

[30] Foreign Application Priority Data

Jun. 16, 1994 [DE] Germany .................. 44 20 988.6

[51] Int. Cl.$^6$ .................. H03K 5/22; G11C 7/00
[52] U.S. Cl. .................. 327/74; 327/76; 365/201; 324/158.1
[58] Field of Search .................. 327/74, 76; 365/201; 371/22.6; 324/158.1

[56] References Cited

U.S. PATENT DOCUMENTS 4,101,839 7/1978 Poole et al. .................. 327/72
5,014,226 5/1991 Horstmann et al. .................. 371/22.6

FOREIGN PATENT DOCUMENTS

0076734A2 4/1983 European Pat. Off. ..
0141681A2 5/1985 European Pat. Off. ..

Primary Examiner—David C. Nelms
Assistant Examiner—Trong Phan
Attorney, Agent, or Firm—Bernard Franzblau

[57] ABSTRACT

Integrated circuits which process analog signals and consist of a plurality of separate functional blocks are difficult to test because the terminals of, internally interconnected functional blocks cannot be simply fed out in view of the limited number of external terminals. In order to test the integrated circuit by testing individual functional blocks separately, it is proposed to connect inputs and outputs of functional blocks are connected to switches enabling connection of these functional blocks to external terminals. The switches are controlled by storage stages which are loaded via a test input which is connected to comparators. These comparators compare the input signal with various reference voltages, the voltage ranges between the reference signals being associated with the logic values "0" and "1" as well as with a clock signal value. This enables a series of data with a data clock to be applied via only one test input in order to switch the internal switches in conformity with the desired test state.

16 Claims, 1 Drawing Sheet

INTEGRATED CIRCUIT FOR INDEPENDENTLY TESTING INDIVIDUAL ANALOG INTERNAL FUNCTIONAL BLOCKS

BACKGROUND OF THE INVENTION

The invention in general relates to the testing of integrated circuits for correct operation after manufacturing. The invention notably relates to the testing of integrated circuits comprising at least some analog circuits.

DESCRIPTION OF RELATED ART

Contemporary integrated circuits for the processing of analog signals become increasingly more complex because ever more functional blocks are combined so as to form an integrated circuit. For each functional block given functions and properties are defined. When these properties are to be tested, for example, the frequency response or non-linear functions, by testing the signal paths as a whole which are accessible from the outside via terminals, can only be incomplete because only the properties of a plurality of functional blocks together are then tested and these properties often influence one another. In many integrated circuits parts of the signal path extend outside the integrated circuit, for example, via external coupling capacitors or discrete filters so that in these cases parts of the signal path can also be tested. In contemporary integrated circuits for analog signals, however, the aim is to minimize the number of external terminals and to avoid adjusting operations as much as possible upon use of such integrated circuits. This can be achieved partly via additional internal control circuits which, however, further complicate the mutual influencing of the functions of the functional blocks. On the other hand, the manufacturer of an integrated circuit must guarantee correct operation in all permissible secondary conditions, so that a great testing expenditure for testing is required.

A test circuit requiring a minimum number of test terminals is known, for example, from EP 0 076 734 A2 in which different voltage levels between the operating voltage and the reference potential of the integrated circuit are used to enter combinations of binary test signals. However, this known circuit evidently is conceived for the testing of purely digital integrated circuits and the cited document does not mention the preferably individual testing of functional blocks in integrated circuits comprising several analog functional blocks.

Furthermore, EP 0 141 681 A2 discloses a circuit arrangement which comprises a test input which enables the circuit to be set to a test state by application of a signal level approximately halfway between the operating voltage and the reference voltage. Evidently, this publication also concerns the testing of a purely digital circuit. In both known circuits it is merely possible to input additional signals, by way of signal levels between the operating voltage and the reference potential, in order to save separate test terminals.

SUMMARY OF THE INVENTION

It is an object of the invention to provide a method of testing an integrated circuit which requires only a minimum number of additional terminals for substantially independent testing of the function of notably analog internal functional blocks.

This object is achieved in accordance with the invention in that the method comprises the following steps:

applying multiple series of test signals via at least one test input, storing the test signals of the series in the integrated circuit in order to control switches between various circuit points of the integrated circuit and/or external terminals, applying, after each series of test signals, a predetermined input signal to at least one terminal and comparing properties of the output signal on at least one other terminal with predetermined properties.

Thus, switches allow the inputs and outputs of individual functional blocks to be connected directly to external terminals in order to test these blocks in an isolated fashion without influencing other functional blocks. The switches also enable by-passing of given functional blocks in the signal path or connection of internal control inputs of such functional blocks to a fixed potential. The switches are controlled via storage stages which are preferably loaded via one input only, via which the test signals are supplied. These may be series of binary signals which are coded in such a manner that a clock signal can be derived therefrom as is the case, for example, with channel codes for CE, so that arbitrary series of control signals for the switches can thus be input via a single input. However, this imposes intricate extraction of the control signals.

A simpler possibility of inputting control signals for the switches consists in applying the test signals with one of several voltage levels in such a manner that a first voltage level represents a logic signal "1", a second voltage level represents a logic signal "0", and a third level represents the separation between temporally successive logic signals.

The control signals and the clock signals can be readily derived from such test signals, only a single input being required. This input for the test signals is preferably an additional input. However, use can also be made of an input already present when exclusively signals of either the operating level or the reference level are applied via this input; this is the case already, for example, for switching signals for internal functions.

Analogously, use can also be made of an additional output via which all desired output signals are output in the test case. In normal operation such an output, like a separate test input would not have a function. However, use can also be made of an output via which signals are also output during normal operation. Because a rather large number of switches can be set to a desired position in each test step by application of a series of test signals, a very extensive testing of even very complex integrated analog circuits is possible.

It is a further object of the invention to provide an integrated circuit arrangement with a test circuit whereby individual functional blocks can be tested substantially independently of other functional blocks, notably with at least some analog circuits, while utilizing a minimum number of additional external terminals.

This object is achieved in accordance with the invention in that the test circuit is connected to the outside via at least one clock terminal and comprises:

a pulse shaper which is connected to the test terminal in order to supply binary signals on a control output and clock signals on a clock output;

a number of storage stages which are coupled to the control output and the clock output in order to store, in response to each clock signal on the clock output, the preceding binary signal on the control output in another storage stage;

a number of switches between different circuit points of the integrated circuit and/or terminals, the switches comprising control inputs which are coupled to outputs of the storage stages.

In an integrated circuit arrangement of this kind practically arbitrary parts of the circuit can be tested individually or in combination with others, for which given parameters can be preset for at least some parts of the circuit.

When a self-clocking binary signal is input, the pulse shaper circuit has to extract the clock signal therefrom; this implies a complex construction of the pulse shaper circuit. However, when the test signal has several voltage levels, a first and second of which are associated with the logic signals "0" and "1", respectively, whereas a third level is associated with the separation between temporally successive logic signals, the circuitry can be reduced when the pulse shaper circuit comprises at least a first and second comparator, each of which comprises two inputs and one output, one input being commonly connected to the test terminal whereas the other input is connected to a first circuit node and a second circuit node, respectively, for different reference voltages, the output producing a signal transition when the signal of each comparator on the test input exceeds or drops below the associated reference voltage, the output of the first comparator being coupled to the clock output and the output of the second comparator being coupled, via a delay circuit, to the control output.

This enables the supply of a series of binary test data, including a data clock, via only one input so as to set a plurality of switches, accordingly.

The reference voltages are effectively chosen when the reference voltage of the first circuit node is lower than that of the second circuit node. The signals for the two binary values of the test data and the data clock can thus be particularly simply represented and evaluated. The normal operation of the integrated circuit can be adjusted after testing in that a given information pattern is written into the storage stages. However, because storage stages normally constitute volatile information stores, which lose their information when the operating voltage is switched off, of the storage stages for driving the switches have to be set each time after switching on. In order to avoid this, an embodiment of the circuit arrangement in accordance with the invention is characterized in that there is provided a third comparator which comprises two inputs and one output, one input also being connected to the test terminal whereas the other input is connected to a third circuit node for a reference voltage, the output being connected to a reset input of all storage stages, and that the control inputs of the switches are connected to the outputs of the memory stages in such a manner that the switches establish connections for normal operation of the integrated circuit when the storage stages are reset. The storage stages can thus be adjusted to a defined state in that the test terminal within an overall circuit, in which the integrated circuit is to be used, is permanently connected to a predetermined potential. The integrated circuit is thus automatically set to the normal operating state. It is then advantageous for the reference voltage of the third circuit node to be lower than that of the first circuit node. In that case it is merely necessary to connect the test terminal to the reference potential to establish the normal state of operation. When the test terminal is connected to reference potential via a resistor, an external connection of the test terminal to a reference potential can even be dispensed with, so that in given circumstances the pattern of conductors is simplified for connection of such an integrated circuit. The properties of the output signals may be, for example, their amplitude, their frequency response or also their waveform.

In the simplest case a storage stage may be associated with each switch. However, because given switch positions preclude one another, it is also possible to connect at least some switches to outputs of a plurality of storage stages via logic gates. Storage stages can thus be saved, and the series of binary test signals may be shorter.

The writing of the successive binary test signals into different storage stages can be realized, for example, as in a distributor. An even simpler possibility consists in that the storage stages are combined in the form of a shift register.

BRIEF DESCRIPTION OF THE DRAWINGS

An embodiment of the invention will be described in detail hereinafter with reference to the drawing.

DETAILED DESCRIPTION OF THE PREFERRED EMBODIMENTS

Figure 1:
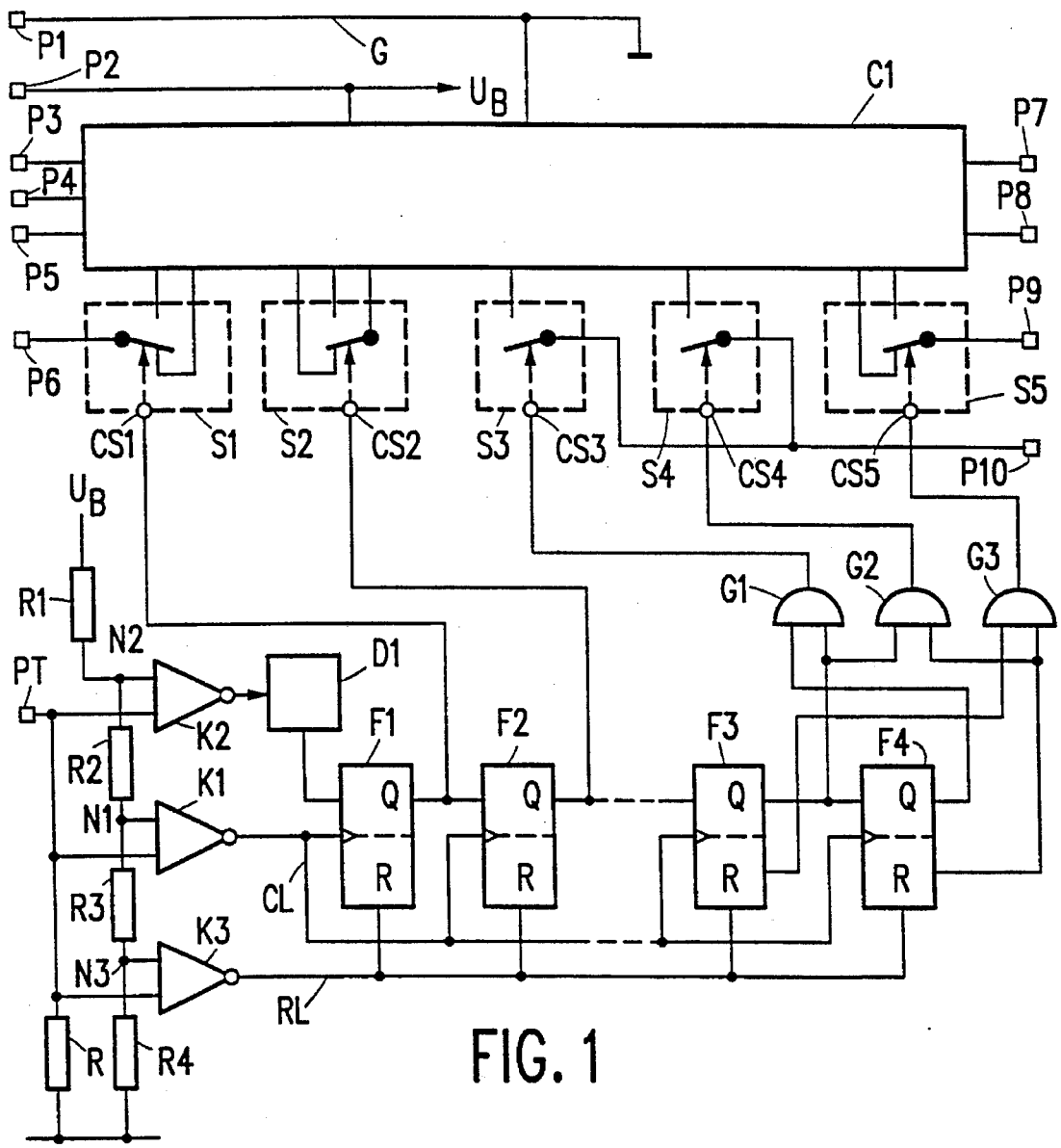
FIG. 1 shows a block diagram of an integrated circuit comprising a test circuit in accordance with the invention for test signals having several voltage levels.

Block C1 in FIG. 1 represents the core of the integrated circuit in which the normal signal processing takes place. The core circuit comprises inputs which are connected to external terminals P3, P4 and P5 as well as outputs which are connected to external terminals P7 and P8. Furthermore, a reference potential G is supplied via a terminal P1 and the operating voltage $U_B$ is supplied via a terminal P2.

The signal processing circuit C1 comprises a number of functional blocks which are not shown in detail and at least some of which are constructed as an analog circuit. Inputs and outputs of these functional blocks are connected to switches S1 to S5 which are either simple switches or change-over switches and whose switching states are determined by signals on control inputs CS1 to CS5. Evidently, the switches S1 to S5 are constructed as electronic switches and are represented as mechanical switches merely for the sake of simplicity.

The switch S1, for example, connects an external terminal P6 to one of two leads of the signal processing circuit C1. In the position shown, the switch S1 can connect, for example, the terminal P1 to an input of a functional block which receives an input signal via the terminal P6 during normal operation, whereas in the other switch position, an input of another functional block is driven, which input is not externally accessible during normal operation. In the switch position shown, the switch S2 connects, for example, an output of a first functional block to an input of a second functional block as required for normal operation of the integrated circuit, whereas in the other switch position, the output of a third functional block is connected to the input of the second functional block in order to test these two blocks together. The output of a third functional block may also be a fixed potential, for example, in order to supply the input of the second functional block with a constant potential, thus enabling it to be tested independently of the first functional block.

The switches S3 and S4, when suitably driven, preferably connect outputs of internal functional blocks to an external terminal P10 which is in this case used exclusively as a test output. A further possibility is shown for the switch S5 which connects an output of a functional block to a terminal P9 in the position shown, representing the normal operating condition, whereas in the other position an output of another functional block is connected instead to the terminal P9 in order to enable testing of said other functional block. Similarly, many other connections from terminals of internal functional blocks to one another, to predetermined potentials or to external terminals are possible.

The switches S1 to S5 are controlled by the outputs of storage stages F1 to F4; the number of such stages may be substantially larger in practice, as denoted by the dashed connections between the storage stages F2 and F3. The switches S3 to S5 are controlled via AND gates G1 to G3 which decode different signal states or contents of the storage stages F3 and F4. Consequently, each time only one of the switches S3 to S5 is driven, whereas the switches S1 and S2 may be simultaneously switched. This depends on the contents of the storage stages F1 to F4.

These contents, i.e. the data contained therein, are successively input via the test input PT. This test input is connected to one input of three comparators K1, K2 and K3, the other inputs of these comparators being connected to circuit nodes N1, N2 and N3, respectively. The circuit nodes N1 to N3 are formed by a voltage divider consisting of resistors R1 to R4 between the operating voltage $U_B$ and the reference potential G. The output of the comparator K1 is connected, via a clock lead CL, to clock inputs of the storage stages F1 to F4, whereas the output of the comparator K3 is connected, via a reset lead RL, to reset inputs R of the storage stages F1 to F4. The output of the comparator K2 is connected, via a delay circuit DL, to the data input of the first storage stage F1, whereas the data input of the subsequent storage stages F2 to F4 are connected to output Q of the respective preceding storage stage. The delay circuit DL is preferably formed by an RS flipflop, notably by a simple RS latch which is continually reset by the positive level of the signal on the clock lead CL. This implementation imposes very low requirements as regards the clock edges, and the clock frequency may vary greatly.

The function of the comparators K1 to K3 and the elements connected thereto will be described with reference to FIG. 2, which shows a typical signal variation on the test input PT.

Figure 2:
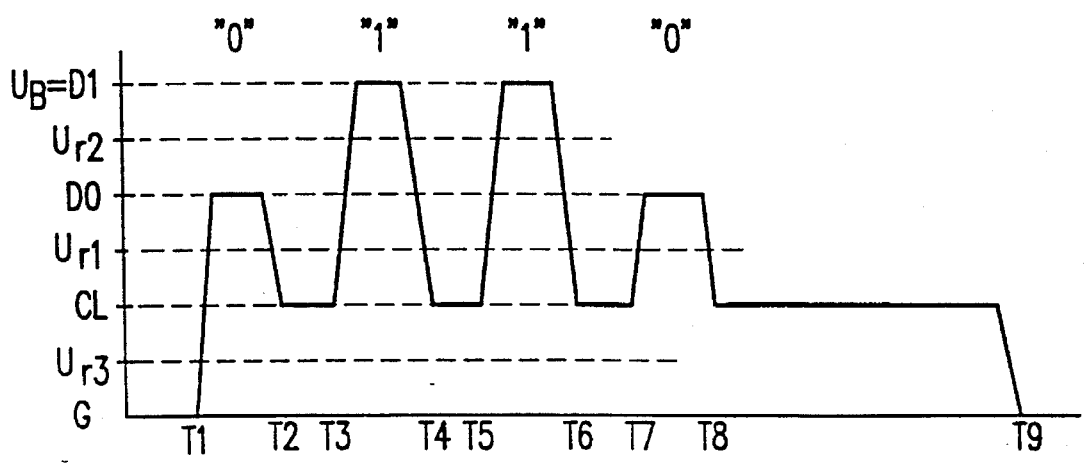
FIG. 2 shows the signals on the test input for a typical series of binary test signals.

FIG. 2 also shows the reference voltages $U_{r1}$, $U_{r2}$ and $U_{r3}$ on the corresponding circuit nodes N1 to N3.

The signal on the test input PT initially equals the reference potential G and is lower than the reference voltage $U_{r3}$, so that the comparator K3 generates a signal on the reset lead RL which resets all storage stages F1 to F4. At the instant T1 the voltage on the test input PT increases to a signal intermediate value D0. This value exceeds the reference voltage $U_{r3}$, so that the signal on the output of the comparator K3 changes and the reset signal on the lead RL disappears. Furthermore, the reference voltage $U_{r1}$ is exceeded, so that the signal on the output of the comparator K1 changes, for example, becomes low, when the clock inputs of the storage stages F1 to F4 respond to a positive clock pulse edge. This signal state can be created by appropriate connection of the inputs of the comparator K1. The reference voltage $U_{r2}$, however, is not exceeded so that the output signal of the comparator K2, and the input signal of the storage stage F1, remains low. This corresponds to the logic signal "0" as indicated above this pulse in FIG. 2.

At the instant T2 the signal on the test input PT changes back to the signal value CL and drops below the reference voltage $U_{r1}$. The comparator K1 then generates a positive clock pulse edge on the clock lead CL, so that the logic "0" is transferred to the storage stage F1.

At the instant T3 the signal on the test input PT changes to the value D1 which in this example corresponds to the operating voltage $U_B$. The signal thus exceeds the reference voltage $U_{r1}$ again, so that the signal on the clock lead CL becomes low again and, moreover, the reference voltage $U_{r2}$ is exceeded, so that the comparator K2 supplies a high signal which is applied to the data input of the storage stage F1 via the delay circuit DL. At the instant T4 the signal assumes the value CL again, so that on the clock lead CL a positive clock pulse edge is generated again. This edge writes the high signal corresponding to a logic "1" into the storage stage F1, because the signal on the output of the comparator K2, now being low, becomes effective in a delayed fashion only because of the delay circuit DL, notably in the form of a D-flipflop, it is activated only after the signal on the clock lead CL has reached the high level.

This procedure is repeated between the instants T5 and T6, so that again a logic "1" is written into the storage stage F1 and the preceding logic "1" is transferred to the storage stage F2. Between the instants T7 and T8 the signal on the test input PT assumes only the signal intermediate value D0, as between the instants T1 and T2, so that after the instant T8 a logic "0" is ultimately written into the storage stage F1, whereas the storage stages F2 and F3 contain a logic "1" (assuming that no further storage stages are present therebetween) and the storage stage F4 contains the logic "0" first input. As a result, the control input CS2 is driven via the output of the storage stage F2 and the control input CS4 is driven via the gate G2, so that the switches S2 and S4 are switched over whereas the other switches remain in the position shown.

Effective values for the signals D1, D0 and CL on the test input PT and for the reference voltages $U_{r1}$ to $U_{r3}$ are, for example

D1=$U_B$=5 V $U_{r2}$=4 V

Do=3.25 V $U_{r1}$=2.5 V

CL=1.75 V $U_{r3}$=1 1V

G=0 V.

The reference voltages stated are obtained when the resistors R1 to R4 of the voltage divider satisfy:

1,5.R1=R2=R3=1,5.R4

After the instant T8, particular terminals P3 to P6 can then be supplied with notably analog input signals which produce output signals at different terminals. These output signals are compared, outside of the integrated circuit, with signals which must be generated on the basis of the applied input signals in the case of correct operation of the tested functional blocks in the signal processing circuit C1.

This test step is terminated at the instant T9 and the input signal then returns to the reference potential G, with the result that on the reset line RL a signal is generated which resets all storage stages F1 to F4 again. However, this is not absolutely necessary when the test is to be continued with a further test step; at the instant T9 immediately a further signal, whose waveform slightly deviates from that shown in FIG. 2 can be input, i.e. with a different sequence of logic signals "0" and "1", in order to control other ones of the switches S1 to S5, and to test other functional blocks.

During normal operation the test input PT may remain non-connected because this test input is pulled to reference potential G by the resistor R, so that the comparator K3 generates, as described, a signal for resetting all storage stages via the reset lead RL. The connections of the terminals of the switches S1 etc. to the functional blocks of the signal processing circuit C1 is chosen so that in this state of the storage stages F1 to F4 all functional blocks are connected to one another or to external terminals as in the normal operating state.

Very complex integrated circuits comprising a plurality of functional blocks which are interconnected in a complex manner can thus be simply and nevertheless fully tested.

I claim:

1. An integrated circuit arrangement comprising external terminals and a test circuit which is connected to the outside via at least one test terminal and which comprises:

at least one pulse shaper connected to the test terminal in order to supply binary signals on a control output and clock signals on a clock output, a number of storage stages coupled to the control output and the clock output in order to store, in response to each clock signal on the clock output, the preceding binary signal on the control output in another storage stage, a number of switches coupled between different circuit points of the integrated circuit and/or terminals, the switches comprising control inputs which are coupled to outputs of the storage stages.

2. A circuit arrangement as claimed in claim 1, wherein the pulse shaper comprises at least a respective first comparator and a second comparator, each of which comprises two inputs and one output, one input being connected to the test terminal whereas the other input is connected to a first circuit node or a second circuit node, respectively, for different reference voltages, the output producing a signal transition when the signal of each comparator on the test input exceeds or drops below the associated reference voltage, the output of the first comparator being coupled to the clock output and the output of the second comparator being coupled, via a delay circuit, to the control output.

3. A circuit arrangement as claimed in claim 2, wherein the reference voltage of the first circuit node is lower than that of the second circuit node.

4. A circuit arrangement as claimed in claim 2 further comprising a third comparator which comprises two inputs and one output, one input also being connected to the test terminal whereas the other input is connected to a third circuit node for a reference voltage, the output being connected to a reset input of all storage stages, and wherein the control inputs of the switches are connected to the outputs of the storage stages in a manner such that the switches establish connections for normal operation of the integrated circuit when the storage stages are reset.

5. A circuit arrangement as claimed in claim 4, wherein the reference voltage of the third circuit node is lower than that of the first circuit node.

6. A circuit arrangement as claimed in claim 5, wherein the test terminal is connected to a reference potential via a resistor.

7. A circuit arrangement as claimed in claim 4 wherein at least some switches are coupled to outputs of a plurality of storage stages via logic gates.

8. A circuit arrangement as claimed in claim 2 wherein the storage stages are combined in the form of a shift register.

9. A circuit arrangement as claimed in claim 2, wherein at least some switches are coupled to outputs of a plurality of storage stages via logic gates.

10. A circuit arrangement as claimed in claim 4, wherein the storage stages are combined in the form of a shift register.

11. A circuit arrangement as claimed in claim 1 wherein said pulse shaper comprises comparison means coupled to said test terminal and to circuit nodes providing reference voltages corresponding to a logic signal "1", a logic signal "0" and a clock signal, and means coupling output means of the comparison means to said storage stages.

12. A circuit arrangement as claimed in claim 11 wherein said reference voltages are at three voltage levels in which the clock signal voltage level is intermediate the other two voltage levels.

13. A method of testing an integrated circuit, comprising the following steps:

applying series of test signals via at least one test input, storing the test signals of the series in the integrated circuit in order to control switches between various circuit points of the integrated circuit and/or external terminals, applying, after each series of test signals, a predetermined input signal to at least one terminal and comparing properties of the output signal on at least one other terminal with predetermined properties.

14. A method as claimed in claim 13, in which the test signals are applied with one of several voltage levels in a manner such that a first voltage level represents a logic signal "1", a second voltage level represents a logic signal "0" and a third level represents the separation between temporaily successive logic signals.

15. A method as claimed in claim 13 wherein the test signals comprise first, second and third voltage levels corresponding to a logic signal "1", a logic signal "0" and a clock signal, respectively.

16. A method as claimed in claim 15 wherein the third voltage level is intermediate the first and second voltage levels.

* * * * *